US006092219A

United States Patent [19]
Porterfield

[11] Patent Number: 6,092,219
[45] Date of Patent: Jul. 18, 2000

[54] METHOD FOR USE OF BUS PARKING STATES TO COMMUNICATE DIAGNOSTIC INFORMATION

[75] Inventor: A. Kent Porterfield, New Brighton, Minn.

[73] Assignee: Micron Technology, Inc., Boise, Id.

[21] Appl. No.: 08/984,115

[22] Filed: Dec. 3, 1997

[51] Int. Cl.⁷ .................................................. G01R 31/38
[52] U.S. Cl. .......................... 714/37; 714/25; 710/100; 710/107
[58] Field of Search ................................ 714/15, 21, 25, 714/37–40, 43, 44, 46–50; 710/100, 107–126

[56] References Cited

U.S. PATENT DOCUMENTS

| 4,912,633 | 3/1990 | Schweizer et al. . | |
|---|---|---|---|
| 4,947,357 | 8/1990 | Stewart et al. | 371/22.3 |
| 4,947,395 | 8/1990 | Bullinger et al. . | |
| 4,953,081 | 8/1990 | Feal et al. . | |
| 4,959,772 | 9/1990 | Smith et al. . | |
| 4,959,775 | 9/1990 | Yonekura . | |
| 5,121,487 | 6/1992 | Bechtolsheim . | |
| 5,133,057 | 7/1992 | Ishii et al. | 395/375 |
| 5,133,058 | 7/1992 | Jensen . | |
| 5,151,900 | 9/1992 | Snyder et al. . | |
| 5,175,733 | 12/1992 | Nugent . | |
| 5,198,759 | 3/1993 | Ohnesorge . | |
| 5,276,814 | 1/1994 | Bourke et al. . | |
| 5,280,591 | 1/1994 | Garcia et al. . | |
| 5,317,711 | 5/1994 | Bourekas et al. | 395/425 |
| 5,331,571 | 7/1994 | Aronoff et al. . | |
| 5,396,602 | 3/1995 | Amini et al. . | |
| 5,404,536 | 4/1995 | Ramakrishnan et al. . | |
| 5,404,538 | 4/1995 | Krappweis, Sr. . | |
| 5,428,623 | 6/1995 | Rahman et al. | 371/22.3 |
| 5,453,992 | 9/1995 | Whetsel . | |
| 5,467,295 | 11/1995 | Young et al. . | |
| 5,488,728 | 1/1996 | Dreyer . | |
| 5,525,971 | 6/1996 | Flynn . | |
| 5,533,205 | 7/1996 | Blackledge, Jr. et al. . | |
| 5,544,311 | 8/1996 | Harenberg et al. . | |
| 5,546,646 | 8/1996 | Williams et al. . | |
| 5,566,300 | 10/1996 | Naoe | 395/183.06 |
| 5,574,730 | 11/1996 | End, III et al. . | |
| 5,581,782 | 12/1996 | Sarangdhar et al. . | |
| 5,610,826 | 3/1997 | Whetsel | 364/487 |
| 5,625,785 | 4/1997 | Miura et al. | 395/568 |
| 5,627,842 | 5/1997 | Brown et al. . | |
| 5,633,828 | 5/1997 | McClure et al. . | |
| 5,636,166 | 6/1997 | Roohparvar | 365/194 |
| 5,657,330 | 8/1997 | Matsumoto . | |
| 5,701,409 | 12/1997 | Gates . | |
| 5,790,811 | 8/1998 | Hewitt . | |
| 5,822,779 | 10/1998 | Intrater et al. . | |
| 5,838,692 | 11/1998 | Tobin . | |
| 5,848,264 | 12/1998 | Baird et al. | 395/500 |
| 5,907,689 | 5/1999 | Tavallaei et al. | 395/290 |

OTHER PUBLICATIONS

PCI to PCI Bridge Architecture Specification.

Primary Examiner—Glenn A. Auve
Assistant Examiner—Jigar Pancholi
Attorney, Agent, or Firm—Dorsey & Whitney LLP

[57] ABSTRACT

A system for flexibly and efficiently communicating diagnostic information about an integrated ASIC device. Where the ASIC is associated with a PCI bus, the bus parking or idle state for the PCI bus is used for placing status or diagnostic information relating to or about the ASIC on the PCI bus. This information can then be observed and used in a debugging process.

21 Claims, 5 Drawing Sheets

METHOD FOR USE OF BUS PARKING STATES TO COMMUNICATE DIAGNOSTIC INFORMATION

FIELD OF THE INVENTION

The present invention relates generally to the use of a bus parking feature for system diagnostics. More specifically, the present invention relates to placing diagnostic information on a bus while the bus is in a parked state.

BACKGROUND OF THE INVENTION

As ASIC devices become more integrated, it has become increasingly difficult to debug new devices, particularly during initial debug testing. Historically, a logic analyzer is used to extract state information from a system to assist in initial debug testing, but due to the large level of integration now used in ASIC design, some of the pertinent state information is buried deep in the chip logic, and is difficult to access with logic analyzers and conventional test equipment.

One solution to this problem is to include dedicated test pins on an ASIC or other device to be tested so that internal state information can be provided on these external pins. However, this solution may be less than optimal because these pins would only be used during debug testing, and rarely (if ever) used again once the device is debugged. Thus, there exists a need for an efficient and cost-effective method for providing internal state information or other diagnostic information for integrated devices such as ASICs.

SUMMARY OF THE INVENTION

In some embodiments, the present invention uses a bus associated with an integrated device to provide diagnostic information about the integrated device during a time where the bus is in a parked or idle state. It is possible to place diagnostic information on the bus in an efficient manner and without disrupting system operation and without the need for additional pins on the integrated device.

In one embodiment of the invention, the invention is a computer comprising (a) a processor, (b) a mezzanine bus, and (c) a chipset attached to the processor and the mezzanine bus. The chipset is configured to operate the mezzanine bus in an active state, operate the mezzanine bus in a parked state, and place diagnostic information on the mezzanine bus during the parked state.

In another embodiment of the present invention, the present invention relates to a method of debugging a device that is connected to a bus that can operate in an active state and a parked state. The method comprises the acts of operating the mezzanine bus in the parked state; placing diagnostic information about the internal states of the device on the bus while the bus is in the parked state; evaluating the diagnostic information; modifying the design of the device in response to the evaluation of the diagnostic information; and disabling the circuitry that places diagnostic information about the internal states of the device on the bus when the bus is in the parked state.

Additional embodiments and features, and the nature of the present invention may be more clearly understood by reference to the following detailed description of the invention, the appended claims, and to the several drawings herein.

DETAILED DESCRIPTION OF THE INVENTION

Figure 1:
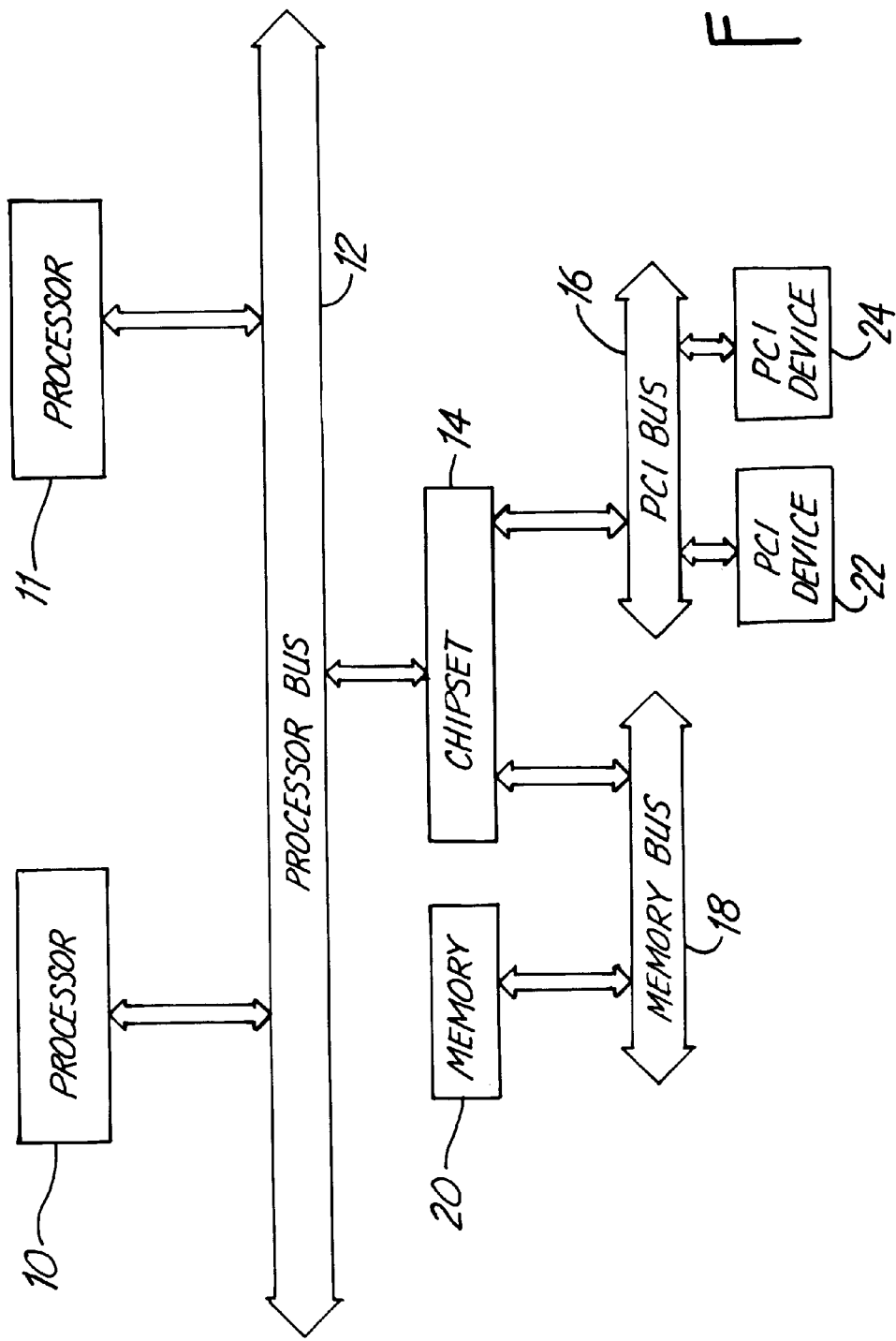
FIG. 1 is a block diagram of a computer system including multiple processors, a processor bus, and a chipset that is associated with a PCI bus and a memory bus.

FIG. 1 is a block diagram of a computer system having a processor bus 12, and a chipset (or core logic) 14. In the embodiment shown, the computer system has two processors 10 and 11, but any appropriate number of processors could be employed in the system of FIG. 1. The chipset is attached to a memory bus 18, which is used to communicate with the system memory 20.

The chipset also is attached to a Peripheral Component Interconnect (PCI) bus 16, which has two PCI devices 22 and 24 attached to it. The PCI bus is a mezzanine bus that acts as an expansion bus, and allows additional components to be added to the system. The PCI bus may operate in the manner described in revision 2.1 of the PCI Specification, which is hereby fully incorporated by reference. Although the present invention is described and illustrated herein principally in terms of the PCI bus, it should be understood that other busses and/or hardware could be configured to operate in accordance with one or more embodiments of the present invention.

When the PCI bus is idle, it may enter a "bus parking" or "arbitration parking" state that is used to ensure that the bus does not float. A primary purpose of bus parking or arbitration parking is power conservation. When signals on the bus are allowed to float, buffers and other logic associated with the PCI bus may "switch" or change state, and this switching will unnecessarily consume power. When the bus is in a parked state, however, the bus is driven to a given value and remains constant, thereby avoiding switching of the buffers and other logic associated with the PCI bus. Usually the value driven on the bus is not important when the bus is in the parked state, as long as it remains sufficiently constant. Bus or arbitration parking as used in the PCI bus context is described in section 3.4.3 of revision 2.1 of the PCI specification.

When an application-specific integrated circuit (ASIC) or other logic device is being debugged, conservation of power is not generally a concern. Thus, when a device is being debugged, the use of bus parking may not be necessary. Thus, it is possible to implement a diagnostic mode that can be used in place of the bus parking state in some circumstances. In such a diagnostic mode, diagnostic or state information can be placed on the PCI bus during the time that the PCI bus would normally be in a bus parking mode. This diagnostic or state information would replace the usual bus parking data, and would be available for facilitating debugging procedures or for other purposes.

Figure 2:
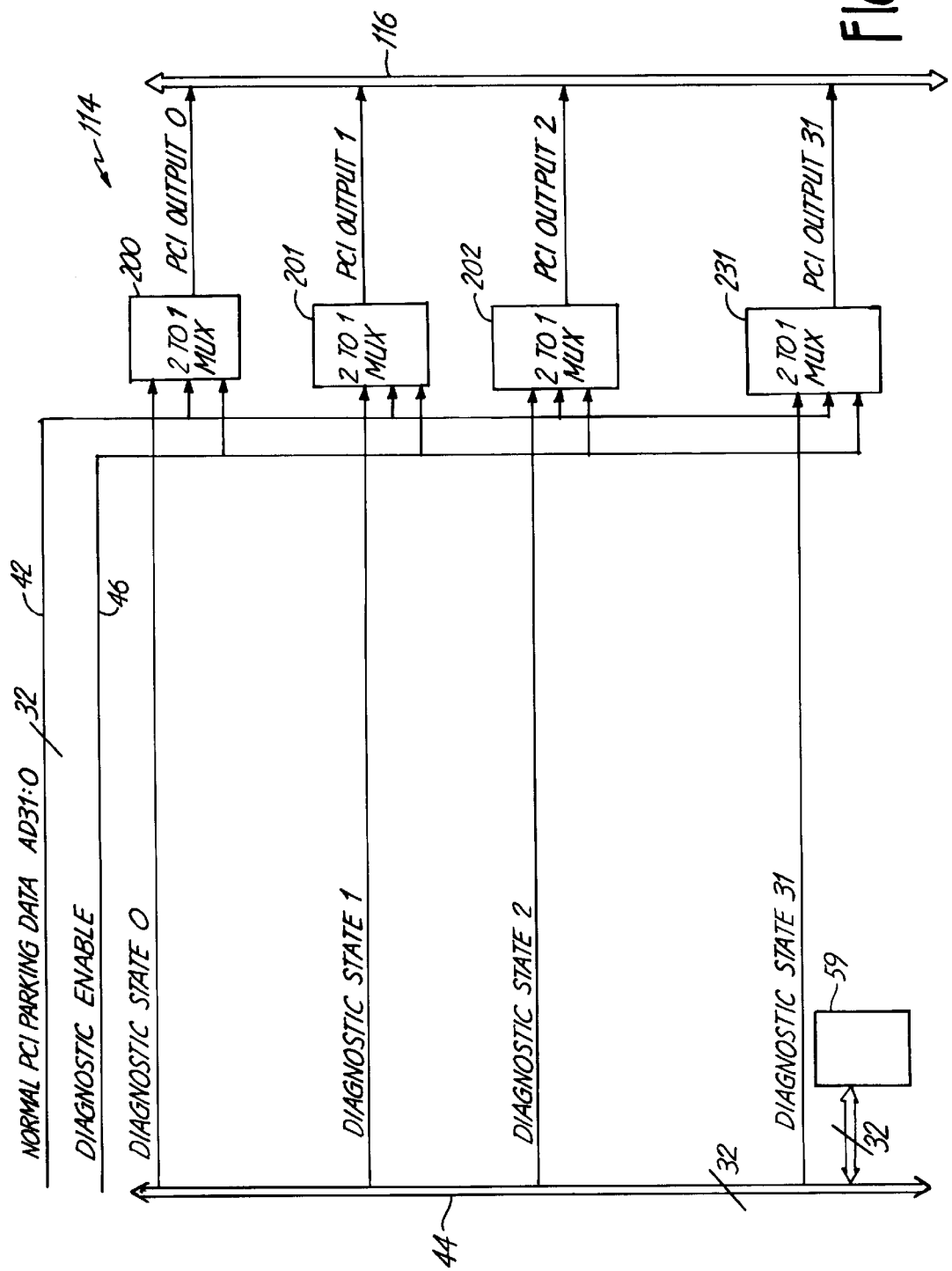
FIG. 2 is a block diagram of a portion of the chipset shown in FIG. 1, showing an embodiment where state information is gated onto the PCI bus.

In the embodiment of FIG. 1, the chipset 14 is an example of logic that is made up of one or more ASICs. As the chipset becomes more integrated, debugging the chipset becomes more difficult because of the integration. FIG. 2 is a block diagram of a portion of the chipset 14 of FIG. 1 that represents one possible implementation of an embodiment of the present invention. The logic of FIG. 2 is configured to provide diagnostic information during the bus parking state. In the embodiment shown in FIG. 2, the 32 bits of PCI bus parking data normally destined for PCI bus lines AD0 to AD31 are represented by bus 42. Thirty-two bits of diagnostic state information are represented by the bus 44. Each of the lines in the bus 44 carries a single bit of information that represents an internal state in an integrated logic device, or each line may be part of a group of lines that represent other state or diagnostic information. The chipset 14 is designed or configured so that diagnostic information or state information is placed on the bus 44 by the device 59. The device 59 may be a portion of an integrated device (i.e., the chipset) to be debugged, or, in another embodiment, it alone may itself be the device to be debugged. The device 59 is configured or designed to expose relevant or useful state information, which can then placed on the bus 44.

Thirty-two multiplexers (multiplexers 200 to 231 in FIG. 2) are used to select between each line of the normal PCI bus parking data on bus 42 and each line of the diagnostic information made available internally on bus 44. A diagnostic enable line 46 is used to select the appropriate input to the multiplexers 200 to 231. When the diagnostic enable line is active, the information on the bus 44 is passed through to the PCI bus 116 shown in FIG. 2. (The PCI bus 116 in FIG. 2 is not part of the chipset 114). Thus, in the embodiment shown in FIG. 2, it is possible to place thirty-two bits of diagnostic information on the PCI bus 116, which are then available for analysis and use for diagnostic or debugging purposes.

In FIG. 2, only the AD lines on the PCI bus are shown on bus 42. However, it should be understood that in addition to the 32 (or 64) AD lines on the PCI bus, it is possible to use other lines on the PCI bus, such as the 4 C/BE lines, to provide additional diagnostic information.

Figure 3:
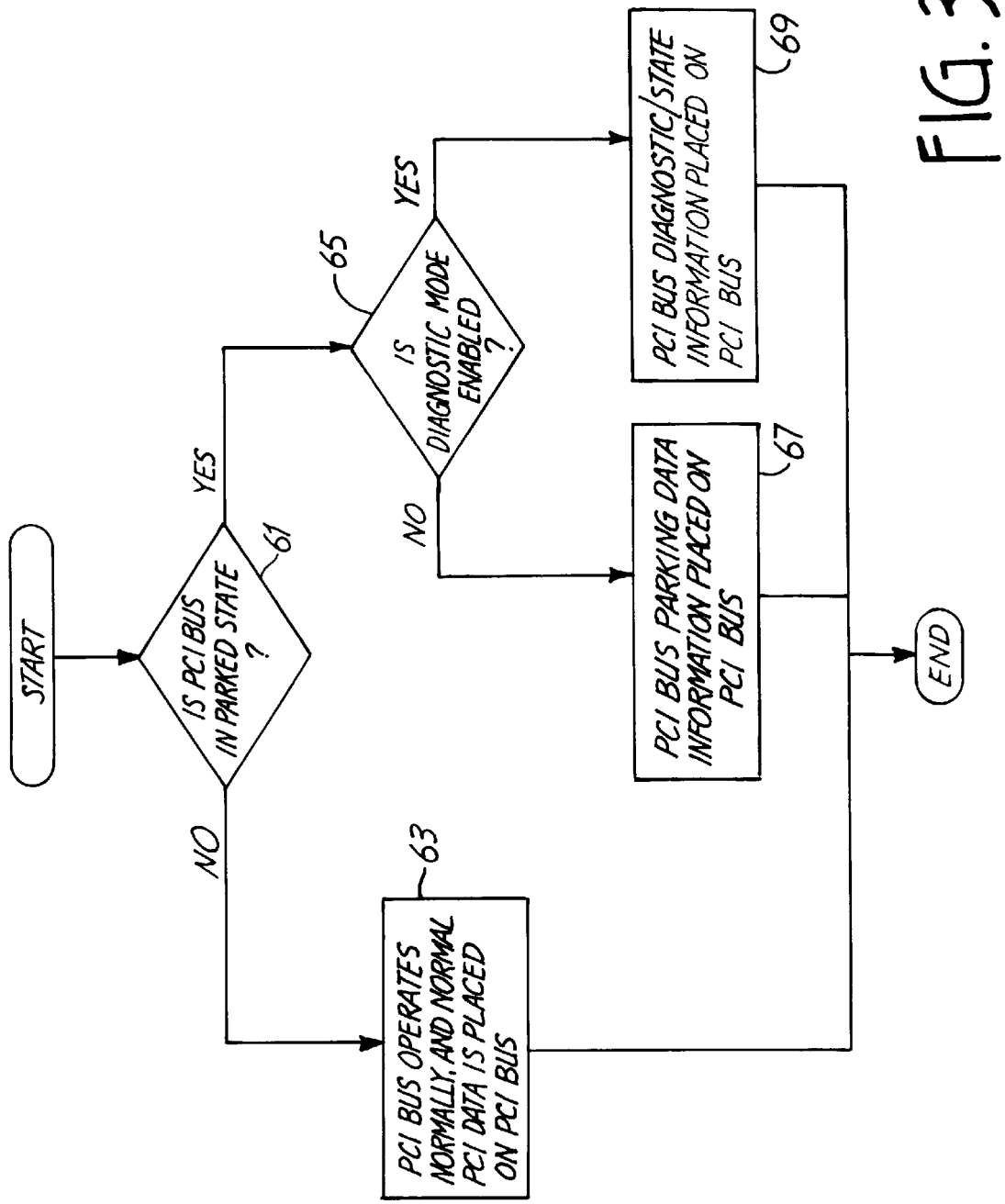
FIG. 3 is a flow chart illustrating a process carried out by the chipset of FIGS. 1 and 2.

FIG. 3 is a flow chart illustrating the operation of the embodiment of FIG. 2. At 61 in FIG. 3, the chipset 114 determines whether the PCI bus is in the parked state. As described in the PCI Specification, the PCI bus is generally in the parked state when two conditions are met: (1) a device (e.g., the chipset) has been arbitrated to, and (2) that device has no transactions to carry out. If the PCI bus is not in the parked state, it is in the active state, so the bus operates normally. In this latter situation, no diagnostic information is placed on the bus 116 in FIG. 2, and the diagnostic enable line 46 is not active.

If the PCI bus is in the parked state at 61 in FIG. 3, then the system further determines at 65 whether the diagnostic mode is enabled. Whether the diagnostic mode is enabled may, in one embodiment, be determined by reading a configuration register that has been designated for storing this status information. In another embodiment, a strapping option could be implemented by configuring a particular register or memory location to store diagnostic configuration information, which is then read at system reset or when the integrated device is reset to determine whether the diagnostic mode is enabled. Thus, analysis of this information would allow a determination of whether the diagnostic mode is enabled. In yet another embodiment, a dedicated pin (or set of pins) on the integrated device could be used to enable or disable the diagnostic mode. Diagnostic mode status could be determined in such an embodiment by accessing the status of this pin.

If the diagnostic mode is not enabled, the diagnostic enable signal on line 46 in FIG. 2 selects the data on bus 42, which then causes the multiplexers 200 to 231 in FIG. 3 to pass the normal bus parking data on bus 42 to the PCI bus 116. In this situation, the bus parking operation proceeds normally, and the normal bus parking data is placed on the bus 116 (67 in FIG. 3).

Where the diagnostic mode is enabled at 65 in FIG. 3, the diagnostic enable signal on line 46 selects the data on bus 44, and this information is passed through the multiplexers onto PCI bus 116 (69 in FIG. 3). Thus, the diagnostic information is placed on the PCI bus in this situation, and is made available for debugging analysis or for other purposes.

Figure 4:
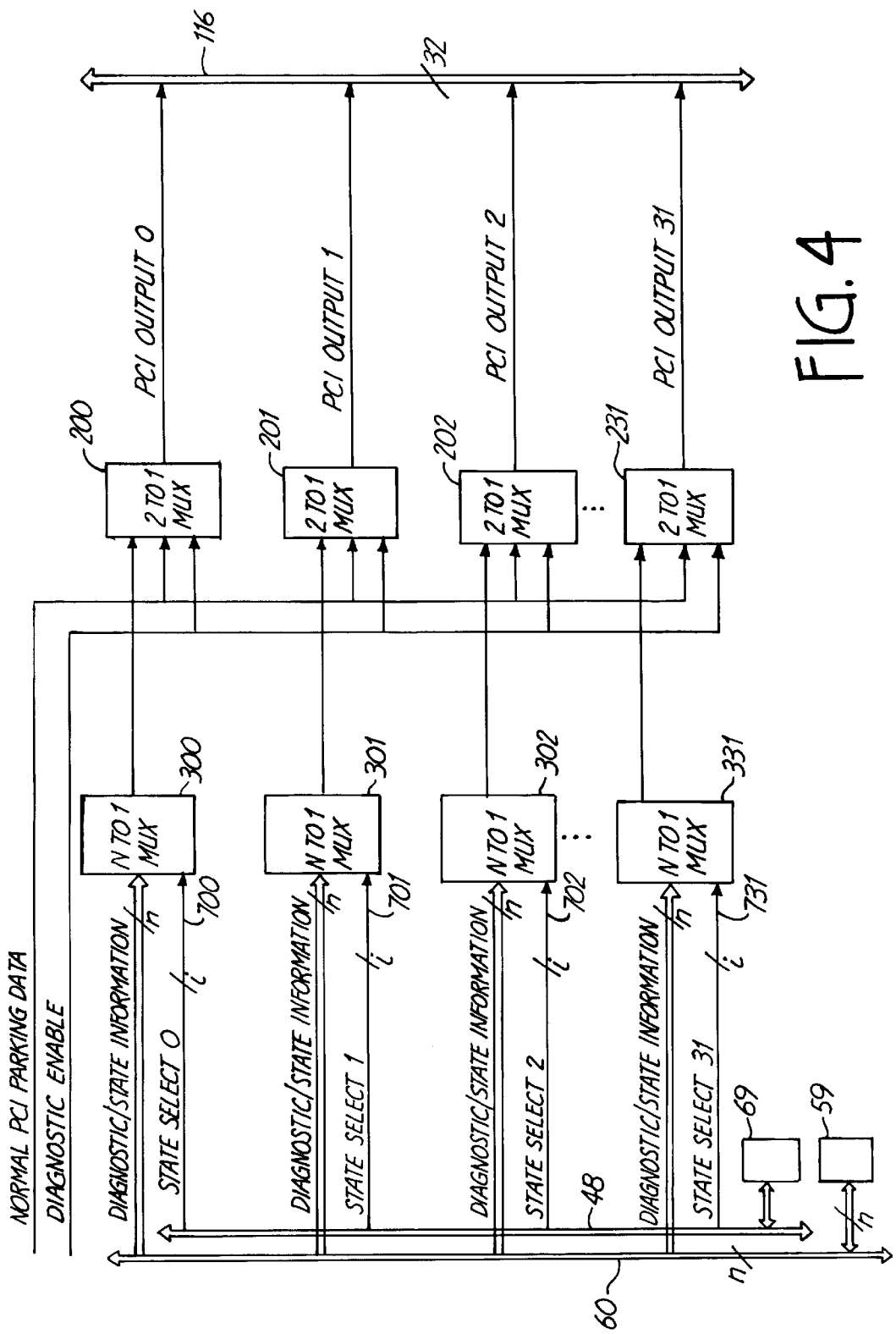
FIG. 4 is an alternate implementation of the portion of the chipset shown in FIG. 2.

FIG. 4 is an alternate implementation of the chipset shown in FIG. 2. In the implementation of FIG. 4, the bus 60 is of width n carrying diagnostic/state information. The bus 60 can be of any appropriate width, and can be of a greater width than the PCI bus. In the embodiment of FIG. 4, the full width n of the bus 60 is provided to each of the n to 1 multiplexers 300 to 331.

The bus 48 in FIG. 4 has state selection signals that are generated by logic 69. In the embodiment shown, the bus 48 carries the state select signals for each of the busses 700 to 731. The busses 700 to 731 select, for each of the multiplexers 300 to 331, one of the lines on the bus 48. Thus, the signals on the bus 48 are configured to select which bit of diagnostic information is to be placed on which lines of the PCI bus 116. The state selection busses 700 to 731 can be of any width, and are shown as having a width i, where $2^i$=n. For each multiplexer, a width i for selection busses 700 to 731 permits selection of a single line of the bus 60. As shown, the output for each multiplexer 300 to 331 is passed through to the multiplexers 200 to 231, and then onto the PCI bus 116.

The state selection signals on busses 700 to 731 are manipulated or configured by the user (or by the software) that is debugging the integrated device. This manipulation could occur in many ways, but one way is to use configuration registers to store information representing the states to be selected. The user programs the configuration registers, thereby configuring the state selection signals. The information in the configuration registers would be used to generate the signals on the state selection busses 700 to 731. Thus, logic 69 represents the configuration registers and the associated logic for generating the state selection signals from the information in the configuration registers.

The implementation of FIG. 4 potentially allows information relating to a large number of states to be placed on the PCI bus 116. Although the number of states that can be placed on the PCI bus 116 (at any one time) is still limited to the width of the PCI bus (e.g., 32 bits), it is possible that the bus 60 can have a width n which is larger than the width of the PCI bus (typically 32 bits), thereby enabling a large selection of diagnostic data. The particular information to be placed on the PCI bus at any given time is selected by the state select lines 700 to 731, which allows both the selection of state information as well as the selection of the particular line on the PCI bus on which each bit of state information is placed.

The implementation of FIG. 4 typically would require a significant amount of transistors to implement. Thus, for some embodiments, a less flexible implementation may be preferred. For example, one might choose to group state information together in groups such as nibbles of 4 bits (or bytes), and then place each 4-bit quantity on any four-bit portion of the PCI bus. Alternatively, it is possible to limit the number of places that particular diagnostic information can be placed on the PCI bus, perhaps permitting particular diagnostic information to be placed only on a particular portion of the PCI bus.

Figure 5:
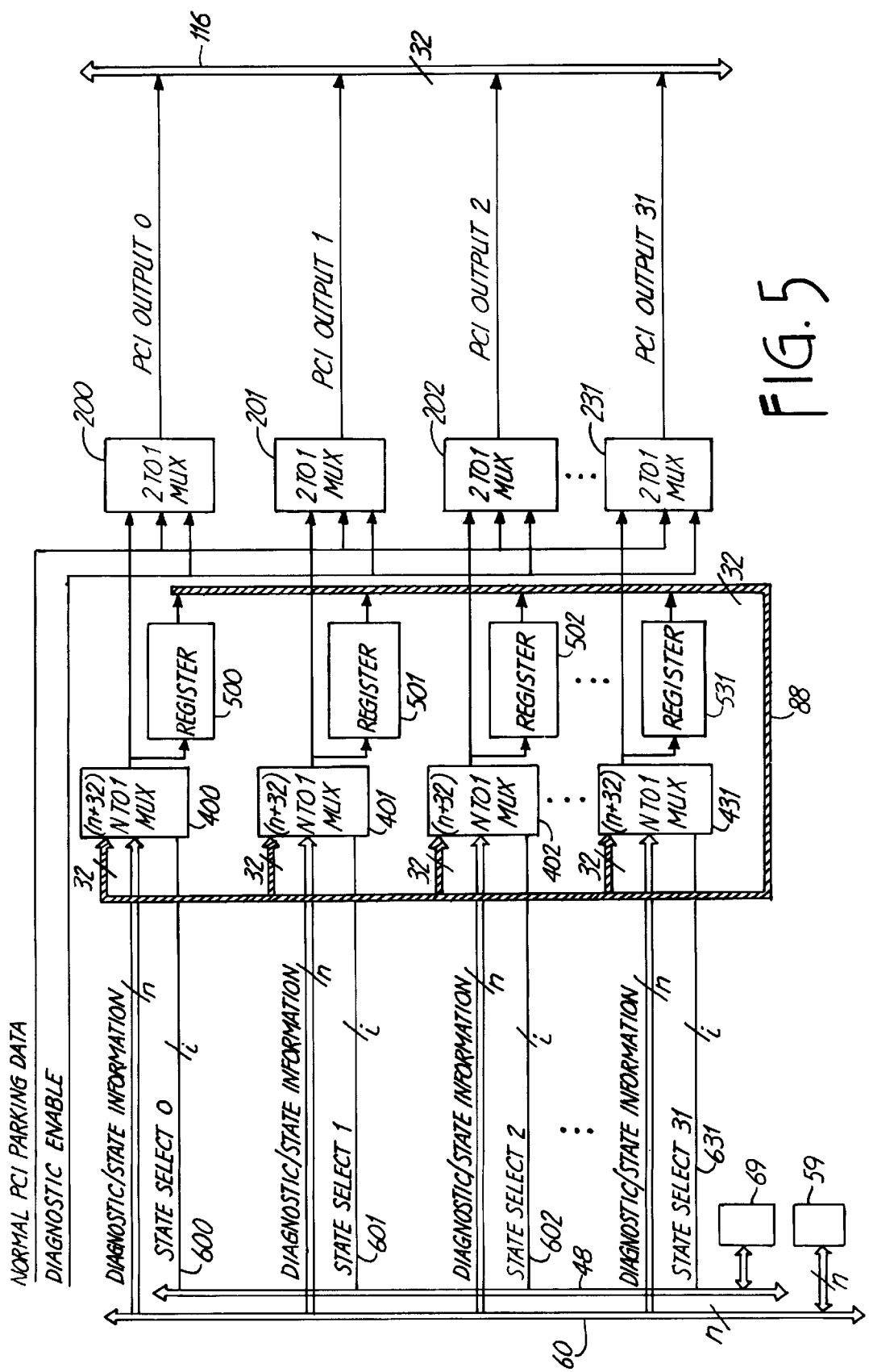
FIG. 5 is an implementation of the portion of the chipset shown in FIG. 2, where a feedback bus is used for stored diagnostic/state information.

FIG. 5 is a representation of another implementation of the chipset 14 shown in FIG. 2. Thirty-two single-bit registers 500 to 531 store the signal generated by the multiplexers 400 to 431. The outputs of the registers 500 to 531 form a thirty-two bit bus 88. In the embodiment of FIG. 5, because there is one single-bit register associated with each of the multiplexers 400 to 431, the width of the bus 88 is the same as the width of the bus 116. The bus 88 is fed back as an input to the multiplexers 400 to 431, thereby making historical information or past state information available for selection by each of the multiplexers. Thus, in the implementation of FIG. 5, the state selection busses 600 to 631 select a line from a set of data that includes not only the diagnostic state information bus 60, but also the data on the feedback bus 88. The multiplexers 400 to 431 are n+32 to 1 multiplexers, and the width of the selection busses 600 to 631 is i, where $2^i$=n+32.

The implementation of FIG. 5 allows a finite number of registers to be used in a flexible manner for displaying recent information about a large number of states, or a longer history of information about a small number of states. Any register can be loaded with either any state information or the output of any other register. Consequently, if there are a finite number of registers, a brief history of many states could be stored, or a long history of a few states could be stored. And where the system is not in diagnostic mode, each register could be fed its own output, thereby conserving power by reducing switching.

The existence of the feedback bus 88 in the embodiment of FIG. 5 provides additional flexibility in selecting which state or diagnostic information is placed on the PCI bus. Such an implementation allows historical state information as well as other difficult to capture information to be analyzed during debugging operations. If the PCI bus operates at a slower clock rate than the ASIC internal clock, then it may be necessary to store diagnostic information for some clock cycles so that it may be placed on the PCI bus during a later clock cycle. For example, if the PCI bus operates at 33 MHz, and the internal ASIC logic operates at 66 MHz, the state for an interim clock cycle could be stored, and then retrieved and placed on the PCI bus on the subsequent edge of the PCI clock. This would give the 33 MHz bus the capability of displaying both clocks of the internal 66 MHz clock.

Additionally, storing state information in the registers 500 to 531 allows state information captured during an active (non-parked) bus condition to be retrieved from storage and later placed on the bus during a subsequent bus parking state. Because the PCI bus may often transition from the active bus state to the idle or parked state, it may be desirable to store diagnostic information during the active bus periods because when the PCI bus is in an active state, the PCI bus is not available for holding diagnostic information. When diagnostic information from active states is of interest, this information can be stored and then later placed on the PCI bus during a subsequent bus parked state.

The state selection inputs in some of the embodiments shown herein could be programmed through normal PCI configuration register mechanisms. However, when configuration registers are used to store selection data for the diagnostic selection registers, it is possible for the supply of configuration registers to be exhausted. Thus, in some embodiments, the use of configuration registers is limited. In other embodiments, techniques are employed to effectively expand the number of configuration registers that are available. In still other embodiments, alternative resources are used.

The techniques described herein may be useful not only for all or a portion of the chipset 14 referred to herein, but also for other logic devices. For example, embodiments of the present invention can be used to debug logic devices on a PCI device, or on other hardware that is connected to the PCI bus. In addition, embodiments of the present invention may be applicable to other bus architectures, and the present invention need not be limited to debugging applications.

In some embodiments of the present invention, the circuitry used to implement the techniques described herein can be disabled when debugging is complete, and when a commercial version of the product is shipped.

Although the present invention has been described in terms of certain embodiments, various changes and modifications, even if not shown or specifically described herein, are deemed to lie within the spirit and scope of the invention and the appended claims.

What is claimed is:

1. A method of debugging a device that is connected to a bus, wherein the bus can operate in an active state and a parked state and wherein the bus must be arbitrated for to be mastered, the method comprising the acts of:

having the device to be debugged arbitrate for the bus and master the bus;

if the device to be debugged does not have any transaction to carry out, then operating the bus in the parked state; and placing diagnostic information about the internal states of the device to be debugged on the bus while the bus is in the parked state, without requiring that the device to be debugged arbitrate for the bus, thereby parking the bus with the diagnostic information.

2. The method of claim 1, wherein the act of placing diagnostic information about the internal states of the device on the bus includes the act of:

selecting which diagnostic information is placed on the bus during the parked state.

3. The method of claim 2, further comprising the act of:

storing diagnostic information.

4. The method of claim 3, wherein the act of selecting which diagnostic information is placed on the bus during the parked state includes the act of:

selecting from the current diagnostic information and the previously stored diagnostic information.

5. The computer of claim 4, wherein the bus is a PCI bus.

6. In a computer comprising a processor, a bus that requires arbitration to be mastered, and a chipset attached to the bus and to the processor through a processor bus, a method for debugging a device by analyzing diagnostic information associated with the device comprising the acts of:

operating the bus in an active state;

having the device to be debugged arbitrate for the bus and master the bus;

if the device to be debugged does not have any transactions to carry out, then operating the bus in a parked state;

placing diagnostic information on the bus during the parked state, without requiring that the device to be debugged perform any further arbitration, thereby parking the bus with the diagnostic information.

7. The method of claim 6, further comprising the act of selecting which diagnostic information is placed on the bus during the parked state.

8. The method of claim 7, further comprising the act of storing diagnostic information.

9. The method of claim 8, further comprising the act of selecting from the current diagnostic information and the previously stored diagnostic information.

10. The computer of claim 9, further comprising the act of storing diagnostic information during an active bus state.

11. In a chipset in a computer that has a processor and a PCI bus, wherein the chipset communicates with the processor, and wherein the PCI bus must be mastered by arbitration, a method for debugging a device by analyzing diagnostic information associated with the device comprising the acts of:

operating the PCI bus in an active state;

having the device to be debugged arbitrate for the bus and master the bus;

if the device to be debugged does not have any transactions to carry out, then operating the bus in a parked state;

generating internal state information relating to the chipset; and placing the internal state information on the PCI bus while the PCI bus is in the parked state, without further arbitrating for the PCI bus, thereby parking the bus with the diagnostic information.

12. The method of claim 11, further comprising the act of selecting which internal state information is placed on the PCI bus during the parking state.

13. The method of claim 12, further comprising the act of storing internal state information.

14. The method of claim 13, wherein the act of placing the internal state information on the PCI bus includes the act of selecting from the current internal state information and the previously stored internal state information.

15. The method of claim 14, further comprising the act of storing internal state information during an active bus state.

16. In a computer having a processor, a PCI bus, a chipset that connects the processor and the PCI bus, and a device to be debugged on the PCI bus, wherein during normal operation, the device on the PCI bus must master the PCI bus by arbitration to initiate a transaction on the PCI bus, a method for debugging a device by analyzing internal state information associated with the device comprising the acts of:

operating the PCI bus in an active state;

having the device to be debugged arbitrate for the bus and master the bus;

if the device to be debugged does not have any transactions to carry out, then operating the bus in a parked state;

generating internal state information about the device to be debugged; and passing the internal state information from the device to be debugged onto the PCI bus, without arbitrating for the PCI bus, thereby parking the bus with the internal state information.

17. The method of claim 16, wherein the act of passing the internal state information from the device onto the PCI bus includes the act of selecting internal state information.

18. The method of claim 17, further comprising the act of storing internal state information.

19. The method of claim 18, wherein the act of passing the internal state information from the device onto the PCI bus includes the act of selecting from the current internal state information and the previously stored internal state information.

20. The method of claim 19, further comprising the act of storing internal state information during an active bus state.

21. In a computer comprising a processor, a bus, and a chipset attached to the bus and to the processor through a processor bus, a method for debugging a device by analyzing diagnostic information associated with the device comprising the acts of:

operating the bus in an active state;

having the device to be debugged arbitrate for the bus and master the bus;

if the device to be debugged does not have any transactions to carry out, then operating the bus in a parked state;

parking the bus with normal bus parking data if the device to be debugged does not have any diagnostic information associated with it; and parking the bus with diagnostic information if the device to be debugged has diagnostic information associated with it.

* * * * *